United States Patent
Le Gallic

(10) Patent No.: US 7,920,122 B2
(45) Date of Patent: Apr. 5, 2011

(54) PRESENCE DETECTION CONTROL KNOB

(75) Inventor: Lan Le Gallic, Montfermeil (FR)

(73) Assignee: Valeo Systems Thermiques S.A.S., Le Mesnil Saint Denis (FR)

( * ) Notice: Subject to any disclaimer, the term of this patent is extended or adjusted under 35 U.S.C. 154(b) by 788 days.

(21) Appl. No.: 11/503,642

(22) Filed: Aug. 14, 2006

(65) Prior Publication Data

US 2007/0052598 A1 Mar. 8, 2007

(30) Foreign Application Priority Data

Sep. 2, 2005 (FR) ...................................... 05 09027

(51) Int. Cl.
*G09G 5/00* (2006.01)
*G06F 3/033* (2006.01)
*H03K 17/94* (2006.01)
*H03K 17/975* (2006.01)

(52) U.S. Cl. ........... 345/156; 345/184; 341/33; 200/600

(58) Field of Classification Search .......... 345/156–172; 463/36–38; 701/36; 341/33, 35; 200/600; 73/862.337
See application file for complete search history.

(56) References Cited

U.S. PATENT DOCUMENTS

| 5,541,622 | A | * | 7/1996 | Engle et al. .................... 345/161 |
| 6,040,821 | A | | 3/2000 | Franz et al. |
| 6,154,201 | A | * | 11/2000 | Levin et al. .................... 345/184 |
| 7,369,119 | B2 | * | 5/2008 | Davani et al. .................. 345/161 |

FOREIGN PATENT DOCUMENTS

DE 3910977 A 10/1990

* cited by examiner

*Primary Examiner* — Bipin Shalwala
*Assistant Examiner* — Keith Crawley
(74) *Attorney, Agent, or Firm* — Howard & Howard Attorneys PLLC

(57) ABSTRACT

Control knob comprising a mobile part (3) capable of being actuated manually and linked with an electromechanical transducer (7). The knob also comprises a metal surface (15) arranged in the vicinity of the mobile part and means to measure the capacitance of the metal surface so that the presence of a finger in the vicinity of the mobile part can be detected.

15 Claims, 3 Drawing Sheets

Figure 1:
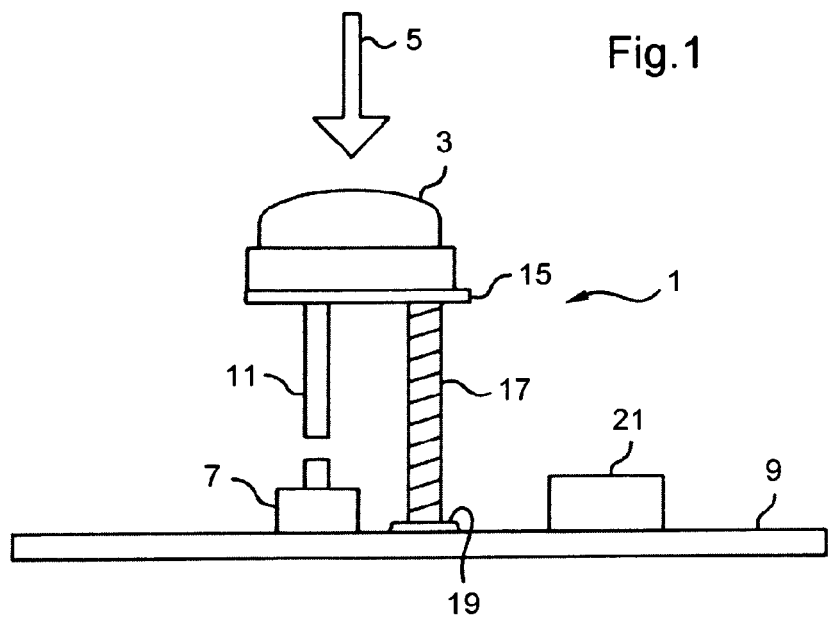

Fig.5
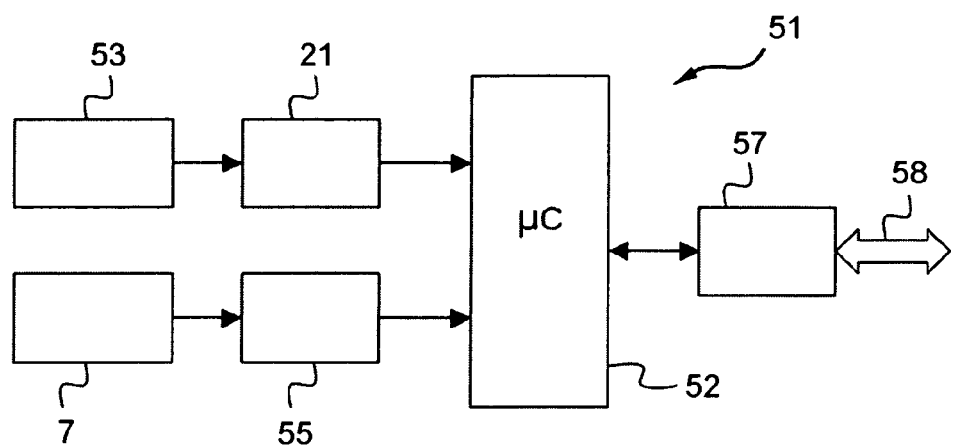
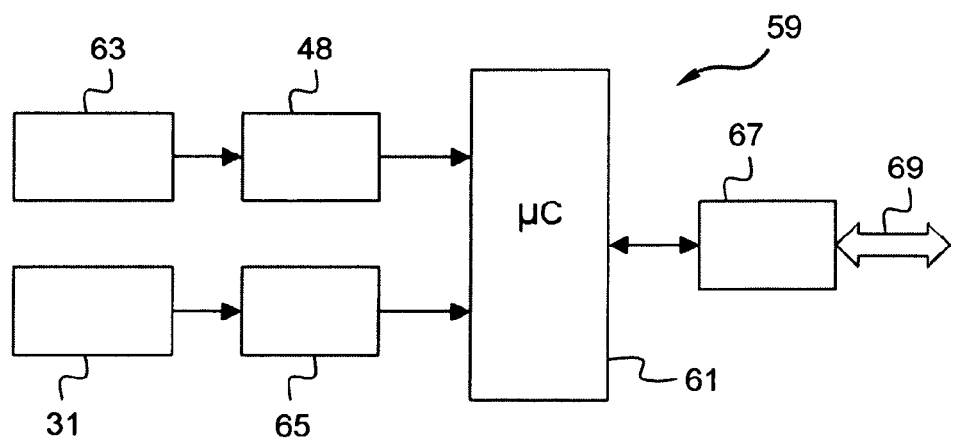
Fig.6

PRESENCE DETECTION CONTROL KNOB

The invention relates to a control knob. It relates more specifically to a control knob comprising a mobile part capable of being actuated manually and linked with an electromechanical transducer.

Numerous knobs of this type are known. For example, they include push buttons, turn buttons, etc. It is understood that the shape of the mobile part may be very different depending on the model. This shape may particularly take into account ergonomic criteria.

In the knobs of the type mentioned in the introduction, the transducer converts the mechanical movement produced on the mobile part by a user into electrical signals that can serve as a command.

However, such devices must be identified so that the user knows the action commanded by a specific knob.

Generally, this identification is provided by affixing a text or graphic key on the knob, or in the vicinity thereof.

In some cases, it is desirable to be able to actuate the knobs blindly, i.e. without requiring the user to directly view the knob to be actuated. It is still necessary to identify the knobs.

The abovementioned knobs cannot be used, as they cannot be identified blindly.

For this reason, the present invention proposes a control knob of the type defined in the introduction, which also comprises a metal surface arranged in the vicinity of the mobile part, and means for measurement of the capacitance of the metal surface so that the presence of a finger on the mobile part can be detected.

As such, it is possible to provide the user with information indicating that his/her finger is positioned on a specific knob and that he/she is set to actuate it. This information may incorporate information identifying the knob. In this way, the user may actuate said knob blindly.

Preferentially, the capacitance measurement means are capable of detecting a variation in the capacitance of the metal surface.

In a first embodiment, the electromechanical transducer comprises a push button-type switch actuated by translation of the mobile part.

In a second embodiment, the electromechanical transducer comprises a rotary incremental encoder-type component actuated by rotating the mobile part.

In the first embodiment, the metal surface is advantageously moveable in translation with respect to the capacitance measurement means.

The metal surface is then advantageously connected to the capacitance measurement means via a spring so that the metal surface and the capacitance measurement means are kept in electrical contact during translation of the mobile part.

The capacitance measurement means may be mounted on a mounting plate.

In an alternative embodiment, the capacitance measurement means are mounted on a printed circuit.

In any case, it is advantageous that the metal surface cooperates with the mobile part by shape complementarity.

In one advantageous embodiment, the metal surface is supported by a dish.

In this case, the dish advantageously comprises a metal-coated joint ring connected to the metal surface so as to connect the metal surface to the capacitance measurement means.

In one particularly advantageous embodiment, the metal surface is produced in the form of a metal blade.

The invention also relates to a control device comprising one or more knobs of this type.

In one specific embodiment, the device comprises a microcontroller connected to the capacitance measurement means via a first interface and to the transducer via a second interface.

Figure 2:
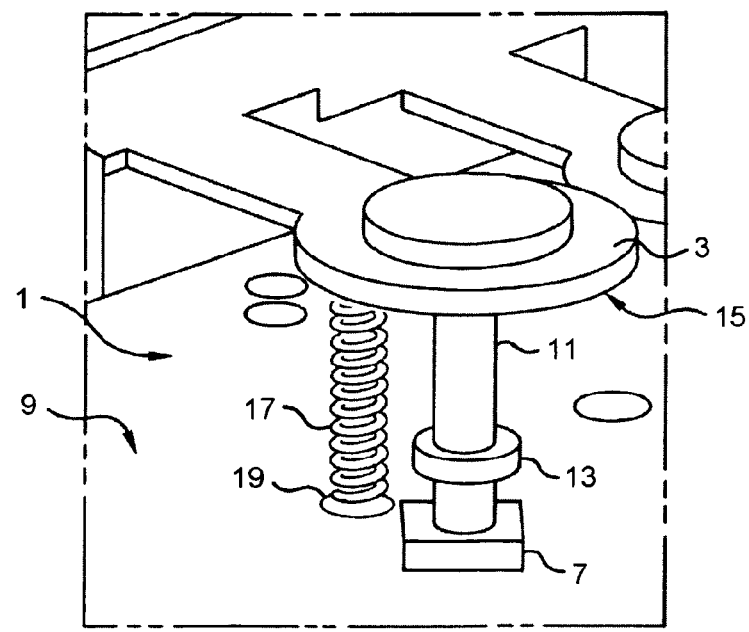
Figure 4:
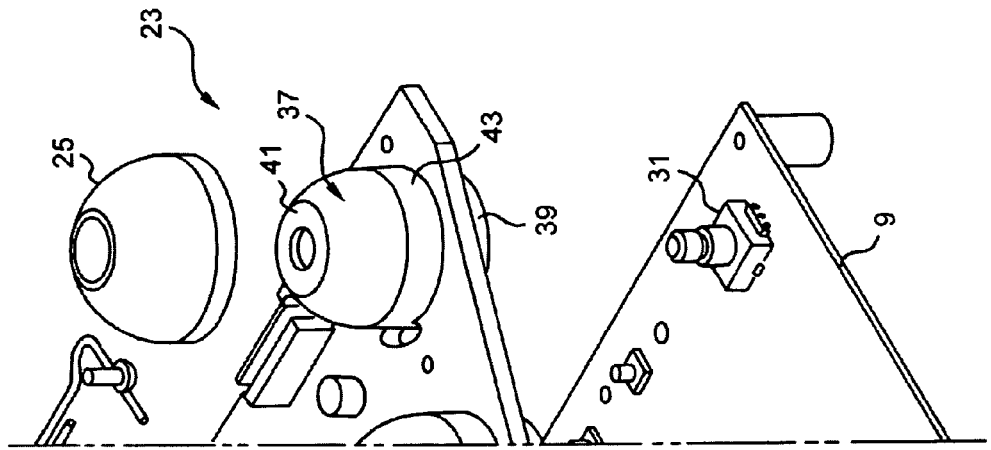
Figure 3:
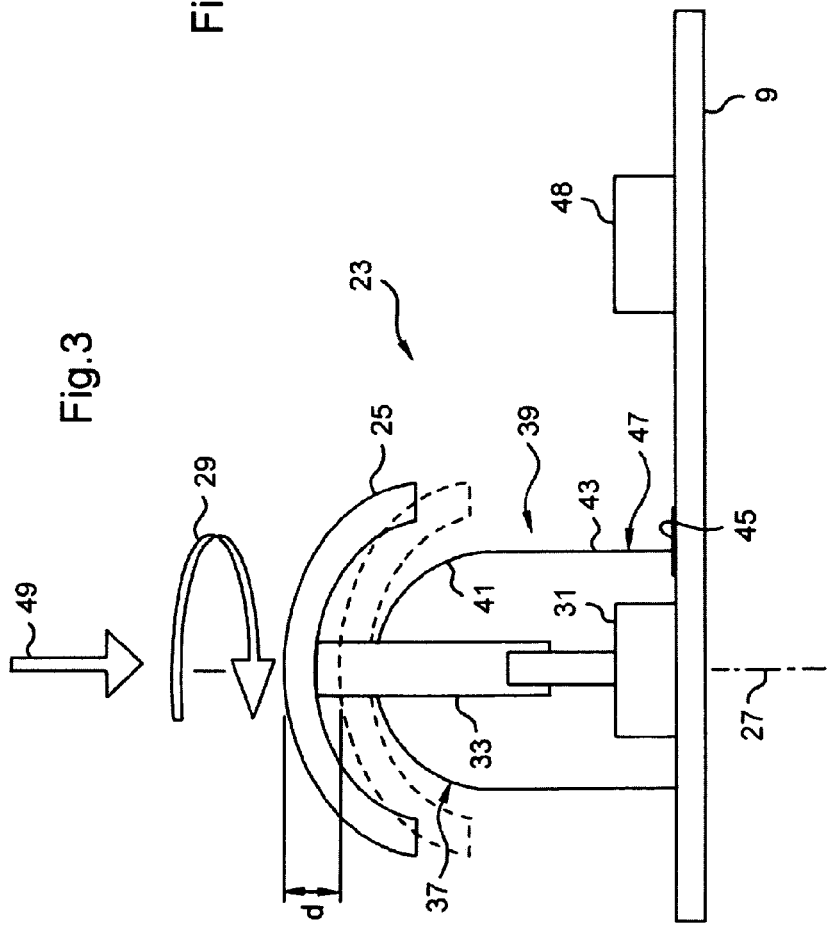

Other characteristics and advantages of the invention will emerge upon examination of the detailed description below and the appended figures wherein:

FIG. 1 is a sectional view of a control knob according to the invention in a first embodiment, FIG. 2 is a perspective view of the control knob in FIG. 1, FIG. 3 is a sectional view of a control knob according to the invention in a second embodiment, FIG. 4 is a perspective view of the control knob in FIG. 3, FIG. 5 is a functional diagram of a control device comprising at least one control knob according to the first embodiment, and FIG. 6 is a functional diagram of a control device comprising at least one control knob according to the second embodiment.

The appended figures may not only complement the invention, but also contribute to its definition, if applicable.

FIGS. 1 and 2 show a first embodiment of the invention. The push button 1 in FIGS. 1 and 2 comprises a mobile part 3, or knob body, capable of being actuated manually, for example by pressing with a finger. The mobile part 3 then advantageously comprises a curved top surface so as to provide good ergonomics for the mobile part 3, as shown in FIG. 2.

The mobile part 3 is capable of moving in translation in a substantially vertical direction, symbolised in FIG. 1 by the arrow 5. In this case, the term "vertical" refers to the arrangement of the push button 1 in FIGS. 1 and 2 and in no way indicates the position of said push button 1 once incorporated, for example in a control device.

The push button 1 also comprises a "push"-type switch 7 mounted on a mounting plate 9. The switch 7 is arranged next to the mobile part 3 so that the translation movement of the mobile part 3 induces the actuation of the switch 7.

In this case, a rod 11 attached to the mobile part 3 is inserted between the switch 7 and said mobile part 3. The rod 11 transfers the forces between the mobile part 3 and the switch 7. The rod 11 is optional: it may be removed when the switch 7 is raised with respect to the mounting plate 9.

The rod 11 may end with an extended bearing surface 13 (FIG. 2) to facilitate the actuation of the switch 7.

The push button 1 also comprises a metal surface produced in this case in the form of a metal blade 15 attached to the mobile part 3. In this case, this blade 15 is arranged on a lower surface of the mobile part 3. A compression spring 17 made of an electrically conductive material rests on the blade 15 and on a metal chip 19 mounted on the mounting plate 9. The blade 15 and the chip 19 are preferentially made of copper or copper alloy. However, any electrically conductive material may be used. The spring 17 is arranged so as to work in the direction of translation of the mobile part 3 indicated by the arrow 5. In this case, the spring is arranged substantially vertically.

By means of the spring 17, the blade 15 and the chip 19 are in continuous electrical contact even during movement of the mobile part 3.

In other embodiments, an additional rod (not shown) may be inserted inside the spring 17 to ensure vertical support and guidance during compression of the spring 17.

The metal chip 19 is connected to capacitance measurement means. These measurement means are capable of detecting and responding to a variation in the capacitance of the blade 15. Such a variation is, for example, caused by the presence of a finger on the mobile part 3. In this case, the capacitance measurement means are produced in the form of a printed circuit (not shown) supported by the mounting plate 9. The printed circuit may include the mounting plate 9 or be mounted thereon.

A processing interface 21 is connected to the chip 19, for example by a wire-type connection. In this way, the capacitance measurement means are capable of responding to a variation in the capacitance of the blade 15 by transmitting a detection signal to the processing interface 21. Such a variation in the capacitance occurs, for example, when a finger is placed on the mobile part 25.

In this case, the processing interface 21 is mounted on the mounting plate 9. It is understood that the processing interface 21 may be arranged in different positions. Other types of connection may be provided between the chip 19 and the processing interface 21, for example a printed circuit portion.

FIGS. 3 and 4 show a second embodiment of the invention. The turn button 23 in FIGS. 3 and 4 comprises a mobile part 25 capable of rotating around a vertical axis 27 as symbolised by the curved arrow 29.

In this case, the mobile part 25 is produced in the form of a dish or thin shell. Preferentially, the dish has a substantially hemispherical shape. In this case, it is made of plastic. However, other materials may be envisaged.

The turn button 23 comprises an electromechanical transducer in the form of an incremental encoder 31 linked with the mobile part 25. The incremental encoder 31 is capable of responding to a turning movement of the mobile part 25 by transmitting electrical signals.

In this case, a rod 33 links, in rotation, the encoder 31 and the mobile part 25. In this case, the rod 33 is an integral part of the mobile part 25.

A mounting plate 9 similar to the mounting plate 9 in FIGS. 1 and 2 supports the encoder 31. A metal surface produced in this case in the form of a metal dish 37 is arranged in the vicinity of the mobile part 25. In this case, the dish 37 is of a complementary shape to the shape of the mobile part 25 and is arranged below it. In this embodiment, the shape of the dish 37 is substantially hemispherical.

The dish 37 is supported by a dish 39 or thin shell having a hemispherical surface 41 similar to the dish 37. The dish 39 is extended by a cylindrical part 43 resting on the mounting plate 35. The metal dish 37 may be produced by metal deposition, or metal coating, on the dish 39.

The metal dish 37 is connected to capacitance measurement means. These measurement means are capable of detecting and responding to a change in the capacitance of the metal dish 37. In this case, the capacitance measurement means are produced in the form of a printed circuit (not shown) supported by the mounting plate 9. The printed circuit may include the mounting plate 9 or be mounted thereon. In particular, a metal chip 45 connected to the printed circuit is arranged next to the dish 39. The chip 9 is preferentially made of copper or copper alloy. Any electrically conductive material may be used. The outer surface of the dish 39 comprises a metal-coated joint ring 47 running from the dish 37 to the metal chip 45, connecting them electrically. In the same way, the metal-coated joint ring 47 may be provided on the inner surface of the dish 39.

A processing interface 48 is connected to the chip 45, for example by a wire-type connection. In this way, the capacitance measurement means are capable of responding to a variation in the capacitance of the metal surface 37 by transmitting a detection signal to the processing interface 48. Such a variation in the capacitance occurs, for example, when a finger is placed on the mobile part 25.

In this case, the processing interface 48 is mounted on the mounting plate 9. It is understood that the processing interface 48 may be arranged in different positions. Other types of connection may be provided between the chip 45 and the processing interface 48, for example a portion of printed circuit.

Although the air-jet is inevitably present between the mobile part 25 and the dish 37, this only influences the capacitance measurement made by the capacitance measurement means only slightly. This air-jet does not impair, for example, the detection of the presence of a finger on the mobile part 25.

Optionally, the mobile part 25 is also capable of translation along the axis 27. This translation is symbolised by the arrow 49 in FIG. 3 and by the dotted line representing the mobile part 25. The electromechanical transducer also comprises a "push button"-type switch function as described in FIGS. 1 and 2. In this case, the push button function is integrated in the encoder 31.

In this embodiment, care is taken to provide between the metal surface 37 and the mobile part 25 a sufficient distance for the stroke of the push button function.

FIG. 5 functionally shows a control device 51 using the push button 1 in FIGS. 1 and 2. The device 51 comprises a micro-controller 52 connected via the processing interface 21 to the capacitance measurement means 53.

The micro-controller is also connected to the switch 7 via an additional processing interface 55 capable of responding to the actuation of the switch 7.

The control device 51 enables the detection of the presence of a finger on the push button 1 and the detection of the actuation of the switch 7. For example, the device 51 may be linked with devices to be controlled via an interface 57 and a communication network 58.

The device 51 may be linked with a display device to comprise a push button whereon a finger is placed before actuating the switch 7 associated with this push button. This is beneficial when it is preferable for a user's attention to be focused on a screen rather than on the push buttons to be actuated.

FIG. 6 functionally shows a control device 59. The control device 59 comprises a micro-controller 61 connected to the capacitance measurement means 63 via the processing interface 48. The micro-controller is connected to the encoder 31 by an additional interface 65.

The control device 59 enables the detection of the presence of a finger on the mobile part 25, the detection of an angle of rotation of the mobile part 25 and, if required, the detection of the actuation of a switch when the mobile part 25 is also capable of vertical translation.

The control device 59 can be linked via an interface 67 and a communication network 69 to devices to be controlled.

The device 59 may be completed or combined with a graphic interface displaying, for example, a representation of a function that can be adjusted by turning/actuating the turn button 23. This representation may be displayed when the presence of a finger is detected.

The push button 1 and/or the turn button 23 linked with the control devices 51 and/or 59 may be incorporated in a control device for an onboard unit control system, for example for a motor vehicle. Such a system may comprise a display device representing the arrangement of the buttons 1 and/or 23 on the control device and the action associated with the buttons 1 and/or 23. Preferentially, the representation of a button 1 and/or 23 is displayed when a user's finger is detected. In this way, the user is informed, without even looking at the button, of the action to be applied. Advantageously, the display device is arranged in a motor vehicle so that the driver can see it without diverting his/her attention from the road. The devices controlled may be a heating, ventilation and/or air conditioning device, musical medium playback device, radio receiver, satellite guidance device or any other device that can be incorporated in a motor vehicle.

Other embodiments may stem from those described above. The finger presence detection means could also be provided on sliding knobs or on levers.

In addition, the devices 51 and 59 may be combined so as to produce a complex control device. In particular, it is understood that in practice, the devices 51 and 61 generally comprise several push buttons 1 and/or turn buttons 23.

The invention finds a very specific application in control devices to be actuated "blindly" and wherein the actions are represented on displays.

The invention is not restricted to the embodiments described above but covers all alternative embodiments that may be envisaged by those skilled in the art.

The invention claimed is:

1. A control knob of a motor vehicle, said control knob comprising:
    an electromechanical transducer (31);
    a mobile part (25) coupled to the electromechanical transducer (31) and rotatably about a vertical axis (27) with the electromechanical transducer (31) disposed below the mobile part (25);
    a metal surface (37) surrounding the electromechanical transducer (31) and coupled to and disposed below the mobile part (25);
    a dish (39) disposed below the mobile part (25) and supporting the metal surface (37) with the dish (39) comprising a metal-coated joint ring (47) abutting the metal surface (37); and
    means to measure the capacitance (63) of the metal surface (37) with the metal surface (37) electrically connected to the capacitance measurement means (63) through the joint ring (47).

2. A control knob according to claim 1, wherein the capacitance measurement means (63) are capable of detecting a variation in the capacitance of the metal surface (37).

3. A control knob according to claim 1, wherein the electromechanical transducer (31) comprises a rotary incremental encoder-type component (31) actuated by rotating the mobile part (25).

4. A control knob according to claim 1, wherein the capacitance measurement means (63) are mounted on a mounting plate (9).

5. A control knob according to any of the above claims, wherein the measurement means are mounted on a printed circuit.

6. A control knob according to claim 1, wherein the metal surface (37) cooperates with the mobile part (25) by shape complementarity.

7. A control device comprising at least one control knob according to claim 1.

8. A control device according to claim 7, further comprising a microcontroller (61) connected to the capacitance measurement means (63) via a first interface (47) and to the electromechanical transducer (31) via a second interface (65).

9. A control knob according to claim 1, wherein the mobile part (25) is spaced from the capacitance measurement means (63) such that the mobile part (25) moves independently of the capacitance measurement means (63).

10. A control knob according to claim 1, further including a rod (33) disposed between the mobile part (25) and the electromechanical transducer (31) such that rotation of the mobile part (25) concurrently rotates the rod (33) about the vertical axis (27) which actuates the electromechanical transducer (31).

11. A control knob according to claim 1, further including a mounting plate (9) supporting the electromechanical transducer (31) such that the electromechanical transducer (31) is disposed between the mounting plate (9) and the mobile part (25).

12. A control knob according to claim 11, wherein the metal surface (37) is disposed between the mobile part (25) and the mounting plate (9) with the mobile part (25) movable independently of the metal surface (37).

13. A control knob according to claim 11, wherein the dish (39) and the metal-coated joint ring (47) are both disposed between the mobile part (25) and the mounting plate (9) with the mobile part (25) movable independently of the dish (39) and metal-coated joint ring (47).

14. A control knob according to claim 11, wherein the measurement means are mounted on a printed circuit with the printed circuit supported by the mounting plate (9).

15. A control knob according to claim 1, wherein the capacitance measurement means (63) is further defined as a capacitance sensor electrically connected to the metal surface (37) through the joint ring (47).

* * * * *

UNITED STATES PATENT AND TRADEMARK OFFICE
CERTIFICATE OF CORRECTION

| | | |
|---|---|---|
| PATENT NO. | : 7,920,122 B2 | Page 1 of 1 |
| APPLICATION NO. | : 11/503642 | |
| DATED | : April 5, 2011 | |
| INVENTOR(S) | : Lan Le Gallic | |

It is certified that error appears in the above-identified patent and that said Letters Patent is hereby corrected as shown below:

On The Title Page Item (73) Assignee: delete "Valeo Systems Thermiques S.A.S." and insert therein -- Valeo Systemes Thermiques S.A.S. --.

Signed and Sealed this
Twenty-third Day of August, 2011

David J. Kappos
*Director of the United States Patent and Trademark Office*